United States Patent
Uetake et al.

(10) Patent No.: US 7,202,675 B2
(45) Date of Patent: Apr. 10, 2007

(54) DEVICE AND METHOD FOR MEASURING TONER CURRENT

(75) Inventors: Shigeo Uetake, Takatsuki (JP); Junya Hirayama, Itami (JP); Masahiko Matsuura, Suita (JP); Takeshi Maeyama, Kawanishi (JP); Yuji Nagatomo, Osaka (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 11/252,521

(22) Filed: Oct. 18, 2005

(65) Prior Publication Data
US 2006/0109011 A1 May 25, 2006

(30) Foreign Application Priority Data
Nov. 24, 2004 (JP) ............... 2004-339667

(51) Int. Cl.
*G01R 27/26* (2006.01)
(52) U.S. Cl. .................. 324/663; 399/29
(58) Field of Classification Search ........ 324/663; 399/29
See application file for complete search history.

(56) References Cited

U.S. PATENT DOCUMENTS 6,014,028 A * 1/2000 Ohashi et al. ......... 324/661
6,223,004 B1 * 4/2001 Kodama .............. 399/44
6,472,887 B1 * 10/2002 Tullis et al. .......... 324/663
6,613,209 B2 9/2003 Ozerov

OTHER PUBLICATIONS

"Experimental Polymer Science, New Edition," vol. 9, *Properties of Polymers (2)—Electrical, Optical, and Magnetic Properties*, The Society of Polymer Science, Japan, Kyoritsu Shuppan Co., Ltd., 1998.

* cited by examiner

*Primary Examiner*—Walter Benson
(74) *Attorney, Agent, or Firm*—Brinks Hofer Gilson & Lione (57) ABSTRACT

A toner current measuring device able to measure a toner current.

The toner current measuring device having provided therein a toner deposit capacitor c1 including an electrode 11 and an electrode 12 disposed in opposition, a reference capacitor c2 having a mechanism for adjusting a capacitance thereof; a power supply unit 4; and a measuring unit 10 for measuring, when a voltage is applied to both capacitors to cause a transfer, between the opposing electrodes, of charged toner deposited on the electrode 11, a difference between currents flowing in the toner deposit capacitor c1 and the reference capacitor c2, the difference being measured as a toner current generated as a result of the transfer of the charged toner.

18 Claims, 8 Drawing Sheets

DEVICE AND METHOD FOR MEASURING TONER CURRENT

This application is based on application No. 2004-339667 filed in Japan, the contents of which are hereby incorporated by reference.

BACKGROUND OF INVENTION

1. Field of the Invention

The present invention relates to a technique for measuring a toner current generated by a transfer of charged toner.

2. Description of the Related Art

Toner is used as image forming particles in image forming devices which employ electrophotography. Image forming devices cause a transfer of toner between members in processes such as developing, copying, and recovery, often utilizing the effects of electric fields to cause the transfer. Measuring the transfer properties of toner in an electric field is, therefore, of importance in terms of the research and development of image forming devices and toner.

The Time of Flight method is known as a conventional method for measuring the transfer properties of charges in members composed of an insulating polymer, etc. The Time of Flight method pre-applies a voltage between opposing electrodes which sandwich the member to be measured, exposes light, an electron beam, X-rays, etc. to the component to cause a generation of a charge, and detects a transfer of the charge, resulting from the voltage, as a current flowing between the electrodes. Using the result of this detection, it is possible to derive transfer properties, such as mobility of the charge, in the member (see chapter 1, pp. 27–30, Experimental Polymer Science New Edition, Vol. 9, "Properties of Polymers (2)—Electrical, Optical, and Magnetic Properties", Society of Polymer Science, Japan, Kyoritsu Shuppan Co., Ltd.).

However, it is difficult to directly apply the aforementioned Time of Flight method to measuring the transfer properties of toner. If this method were used as is, a voltage could be applied between opposing electrodes after a toner layer is formed on one of the electrodes, and the transfer of the toner as a result of the voltage could be detected as a current flowing between the electrodes. As a result, however, the presence of a capacitance between the opposing electrodes causes a charging current to flow along with the toner current from the application of the voltage. Accordingly, it is impossible to measure only the toner current since any result of the measurement of the current flowing between the electrodes includes the charging current component.

SUMMARY OF INVENTION

An object of the present invention is to provide a toner current measuring device and toner current measuring method able to measure only the toner current.

A toner current measuring device pertaining to the present invention includes a toner deposit capacitor having opposing electrodes, charged toner to be deposited on one of the electrodes; a reference capacitor having a variable capacitance, to be configured by a user adjustment with a capacitance substantially equal to a capacitance of the toner deposit capacitor having charged toner deposited on the one electrode; a power supply unit operable to supply power in parallel to the toner deposit capacitor and the reference capacitor; and a measuring unit operable, when the power supply unit applies a voltage to both capacitors which causes a transfer, between the opposing electrodes, of the charged toner deposited on the one electrode, to measure a difference between a current flowing in the toner deposit capacitor and a current flowing in the reference capacitor, the difference being measured as a toner current generated by the transfer of the charged toner.

A toner current measuring method pertaining to the present invention includes a depositing step of depositing charged toner on one of opposing electrodes provided in a toner deposit capacitor; an adjusting step of adjusting a capacitance of a reference capacitor having a variable capacitance to be substantially equal to a capacitance of the toner deposit capacitor having the one of the electrodes with charged toner deposited thereon; and a measuring step of measuring, after the depositing step and the adjusting step and upon applying in parallel a voltage to both capacitors to cause a transfer, between the opposing electrodes, of the charged toner deposited on the one of the electrodes, a difference between a current flowing in the toner deposit capacitor and a current flowing in the reference capacitor, the difference being measured as a toner current generated by the transfer of the charged toner.

According to the above structure, a composite current consisting of the charging current and the toner current flows in the toner deposit capacitor, while a charging current flows in the reference capacitor. If the capacitances of both capacitors are adjusted to be substantially equal, the charging currents flowing in both capacitors will be substantially equal, thereby enabling a measurement of a difference between the currents flowing in both capacitors as the toner current.

Also, there are cases in which the capacitance of the toner deposit capacitor differs per measurement depending on errors in a thickness and a size of the deposited toner layer. Furthermore, there are cases in which the thickness and the size of the deposited toner layer are made different per measurement in order to measure the toner current under various measurement conditions. According to the above structure, it is possible to adjust the capacitance of the reference capacitor per measurement to be substantially equal to the capacitance of the toner deposit capacitor.

In the toner current measuring device of the present invention, the measuring unit may be further operable, when the power supply unit applies a weak voltage to both capacitors which prevents the transfer, between the opposing electrodes, of the charged toner deposited on the one of the electrodes, to measure a difference between the current flowing in the toner deposit capacitor and the current flowing in the reference capacitor, the difference being measured as an indicator for adjusting the capacitance of the reference capacitor.

When the weak voltage is applied to both capacitors, charging currents flow in both capacitors based on their respective capacitances. The difference between the charging currents corresponds to the difference between the capacitances of both capacitors. Accordingly, it is possible to equalize the capacitances of both capacitors by adjusting the capacitance of the reference capacitor to minimize the difference between the charging currents.

In the toner current measuring device of the present invention, both opposing electrodes of the toner deposit capacitor may have a cylindrical surface shape.

In actual image forming devices, toner often moves between cylindrical surface-shaped members such as a photosensitive drum and a development roller. According to the above structure, it is possible to measure the toner current under conditions close to the shapes of actual members.

In the toner current measuring device of the present invention, an area of each of the opposing electrodes of the toner deposit capacitor may be between 1 cm$^2$ and 10 cm$^2$ inclusive.

In actual image forming devices, the area of the region in which the electric field acts, such as between the photosensitive drum and the development roller, is often in the above numeric range. According to the above structure, it is possible to measure the toner current under conditions close to the actual region in which the electric field acts.

In the toner current measuring device of the present invention, the electrode having toner deposited thereon, being one of the opposing electrodes of the toner deposit capacitor, may be composed of a conductive elastomer.

In actual image forming devices, toner is often deposited on a member composed of conductive elastomer, such as a development roller. According to the above structure, it is possible to measure the toner current under conditions close to the material of an actual member.

In the toner current measuring device of the present invention, the toner deposit capacitor may further have an electrode distance adjustment mechanism for adjusting a distance between the opposing electrodes.

In actual image forming devices, toner moves between various members, such as between a development roller and a photosensitive drum, or between a photosensitive drum and a transcription roller. The distance between these members often varies. The distance between members also varies if the model of the image forming device varies, even if the same members are used. According to the above structure, it is possible to measure the toner current under conditions close to actual image forming devices.

In the toner current measuring device of the present invention, a waveform of the voltage applied by the power supply unit may be a stepped waveform.

According to the above structure, the power supply unit can cause the application of a voltage with, for example, a stepped waveform which transforms from 0 V to 800 V. In such a case, it is possible to derive the mobility of the toner from the detection result for the toner current.

In the toner current measuring device of the present invention, the power supply unit may apply an alternating voltage.

According to the above structure, the power supply unit can cause the generation of a voltage with, for example, a rectangular waveform which alternates between −400 V and +800 V. In such a case, it is possible to derive the mobility of the toner under an alternating electric field from the detection result for the toner current. As a result, it is possible to derive a detachability and other reciprocating behaviors of toner under an alternating electric field.

In the toner current measuring device of the present invention, the measuring unit may comprise a first impedance element that is connected in series to the toner deposit capacitor; a second impedance element that is connected in series to the reference capacitor and having an impedance substantially equal to an impedance of the first impedance element; and a detector operable to detect a difference between (i) a voltage induced at both ends of the first impedance element according to the current flowing in the toner deposit capacitor and (ii) a voltage induced at both ends of the second impedance element according to the current flowing in the reference capacitor, the difference being detected as a signal showing an amount of the toner current. According to the above structure, it is possible to accurately measure the toner current.

In the toner current measuring device of the present invention, the first impedance element may be a resistive element, and a time constant of a CR circuit constituted from the toner deposit capacitor and the resistive element may be from 1 nsec to 1 μsec inclusive.

In terms of the responsiveness of the circuits, a faster time constant of the CR circuits is preferable. The reason for this is that since the variation of the voltage between the electrodes becomes slower if the time constant is too slow, the transfer of the toner will completely finish before changing the voltage between the electrodes to the desired voltage. This problem arises if the time constant is longer than 1 μsec. On the other hand, there are limits, in terms of detection sensitivity, to reducing the time constant of the CR circuits. In order to reduce the time constant, it is necessary to reduce the size of the electrodes, thereby degrading the detection sensitivity for the current. This problem arises if the time constant is shorter than 1 nsec. According to this structure, it is possible to avoid the aforementioned problems relating to the responsiveness of the circuits and the detection sensitivity for the current.

In the toner current measuring device of the present invention, an electrical property of a wiring which connects a first electrode of the toner deposit capacitor and the first impedance element may be substantially the same as an electrical property of a wiring which connects the first electrode of the reference capacitor and the second impedance element, an electrical property of a wiring which connects the first impedance element and the power supply unit may be substantially the same as an electrical property of a wiring Which connects the second impedance element and the power supply unit, an electrical property of a wiring which connects a second electrode of the toner deposit capacitor and the power supply unit may be substantially the same as an electrical property of a wiring which connects the second electrode of the reference capacitor and the power supply unit, and an electrical property of a wiring which connects the first impedance element and the detector may be substantially the same as an electrical property of a wiring which connects the second impedance element and the detector.

It is possible to improve the accuracy of the measurements by matching the electrical properties of the wiring as in the above structure.

In the toner current measuring device of the present invention, the toner deposit capacitor, the reference capacitor, the first impedance element, the second impedance element, the detector, and the interconnecting wiring may be stored in a shield-container which blocks electromagnetic waves.

According to the above structure, it is possible to suppress noise caused by electromagnetic waves to a minimum, thereby enabling an improvement in the sensitivity of the measurement.

In the toner current measuring method of the present invention, the adjusting step may adjust, after the depositing step and upon applying a weak voltage to prevent the transfer of the charged toner deposited on the one of the electrodes, the capacitance of the reference capacitor so as to minimize the difference between the current flowing in the toner deposit capacitor and the current flowing in the reference capacitor.

According to the above structure, charging currents flow in both capacitors based on their respective capacitances when a weak voltage is applied to both capacitors. The difference between the charging currents corresponds to the difference between the capacitances of both capacitors.

Accordingly, it is possible to equalize the capacitances of both capacitors by adjusting the capacitance of the reference capacitor to minimize the difference between the charging currents.

In the toner current measuring method of the present invention, the weak voltage applied in the adjusting step may be an alternating voltage.

According to the above structure, charging currents steadily flow in both capacitors, thereby making the adjustment of the capacitance simple.

In the toner current measuring method of the present invention, an amplitude of the weak voltage applied in the adjusting step may not exceed 1/10 the amplitude of the voltage applied in the measuring step.

According to the above structure, it is possible to suppress the movement of the toner in the adjusting step to a minimum.

The toner current measuring method of the present invention may further comprise a sealing step of sealing, before the depositing step, charged toner and a carrier liquid between the opposing electrodes of the toner deposit capacitor, while sealing the same carrier liquid between electrodes of the reference capacitor.

Besides toner, carrier liquid ions are present in the liquid developer as charge carriers. Accordingly, it is necessary to cancel not only the charging current but also the current resulting from the movement of the ions (hereafter, ion current) when the liquid developer is to be measured. According to the above structure, when measuring the toner current, a composite current consisting of the toner current, the ion current flow, and the charging current flows in the toner deposit capacitor, while a composite current consisting of only the charging current and the ion current flows in the reference capacitor. If the capacitances of both capacitors are adjusted to be substantially equal, the charging currents flowing in both capacitors will be substantially equal, thereby enabling the measurement of the difference between the currents flowing in both capacitors as the toner current.

In the toner current measuring method of the present invention, the depositing step may deposit charged toner on one of opposing electrodes by applying a DC voltage to the toner deposit capacitor.

According to the above structure, is it possible to easily deposit toner from the liquid developer on the electrode.

BRIEF DESCRIPTION OF DRAWINGS

These and other objects, advantages and features of the invention will become apparent from the following description thereof taken in conjunction with the accompanying drawings which illustrate specific embodiments of the present invention.

In the drawings.

DETAILED DESCRIPTION OF PREFERRED EMBODIMENTS

Preferred embodiments of the present invention are described below with reference to the drawings.

Embodiment 1

Structure

Figure 1:
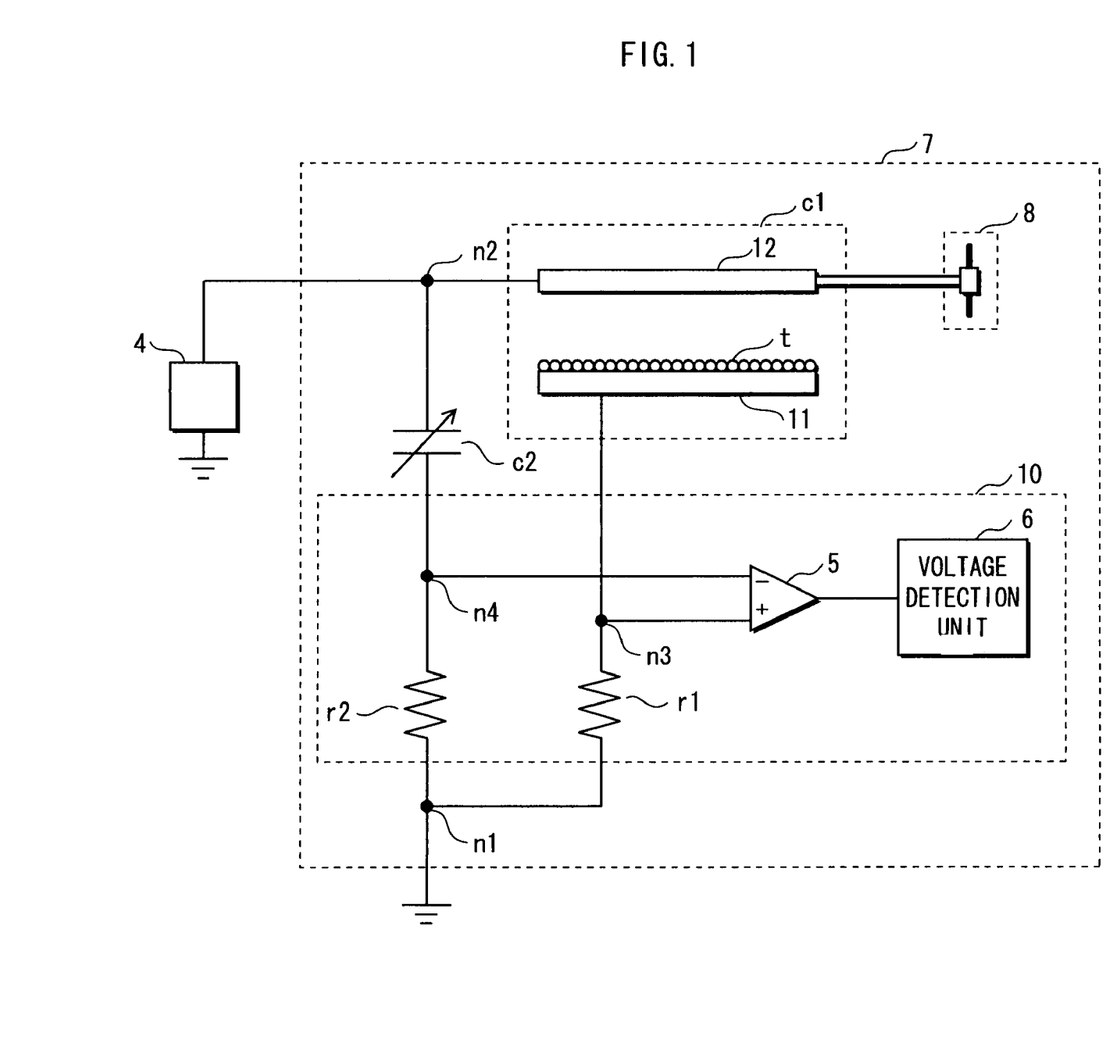
FIG. 1 shows a structure of a toner current measuring device according to embodiment 1.

FIG. 1 shows a structure of a toner current measuring device according to embodiment 1.

The toner current measuring device is composed of a toner deposit capacitor $c1$, a reference capacitor $c2$, a power supply unit 4, a measuring unit 10, and a shield container 7.

The toner deposit capacitor $c1$ has an electrode 11 and an electrode 12 which are disposed in opposition at a predetermined interval. An adjustment mechanism 8 for adjusting the interval between the electrodes is also provided in the present embodiment. The adjustment mechanism 8 is structured from a supporting member which supports the electrode 12 and a column which movably supports the supporting member. The interval between the electrodes 11 and 12 is adjusted arbitrarily by the adjustment mechanism 8. It is possible to use, for example, an electrophoretic cell disclosed in U.S. Pat. No. 6,613,209 as the toner deposit capacitor $c1$. This published patent discloses a structure in which the electrophoretic cell has a micrometer, and which adjusts and measures the electrode interval using the micrometer. Note that an optical element for the purpose of optically measuring the transfer of toner is included in the electrophoretic cell disclosed in the published patent, although the optical element can be omitted since measuring of the transfer of toner is performed electrically rather than optically in the present embodiment.

When measuring the toner current, a toner layer t is formed on the electrode 11 of the toner deposit capacitor $c1$. The toner layer t is formed, for example, by causing a deposit of toner on the electrode 11 using magnetic brush developing.

The reference capacitor $c2$ is a variable-capacity capacitor. When measuring the toner current, the capacitance of the reference capacitor $c2$ is adjusted to be substantially equal to the capacitance of the toner deposit capacitor when the toner layer t is formed on the electrode 11.

The power supply unit 4 has a first terminal and a second terminal, and is a variable voltage power supply which generates a voltage between the first and second terminals and can arbitrarily adjust the level and the waveform of the voltage. The first terminal is connected to a node n1, while the second terminal is connected to a node n2. It is supposed that a shape of the voltage waveform is arbitrarily selectable from, for example, stepped, rectangular, blank pulse, trapezoidal, etc. It is also supposed that the voltage amplitude is arbitrarily adjustable.

The measuring unit 10 has a circuit structure for measuring a difference between a current flowing in the toner deposit capacitor $c1$ and a current flowing in the reference capacitor $c2$. The measuring unit 10 includes resistive elements $r1$ and $r2$, a differential amplifier 5, and a voltage detection unit 6.

The resistive elements $r1$ and $r2$ each have a substantially uniform electrical resistance. The resistive element $r1$ induces a voltage according to the current flowing in the toner deposit capacitor c1. That is, a voltage is generated between the node n1 and a node n3 which are positioned at the ends of the resistive element r1. The resistive element r2 induces a voltage according to the current flowing in the reference capacitor c2. That is, a voltage is generated between the node n1 and a node n4 which are positioned at the ends of the resistive element r2.

One end of the resistive element r1 is connected to the node n1, while the other end is connected to the node n3. One end of the resistive element r2 is connected to the node n1, while the other end is connected to the node n4.

The differential amplifier 5 outputs a signal voltage according to a difference in potential between the node n3 and the node n4, where the node n3 is a connection point between the resistive element r1 and the electrode 11, and the node n4 is a connection point between the resistive element r2 and the reference capacitor c2.

The voltage detection unit 6 detects the signal voltage output by the differential amplifier 5 as a signal corresponding to the toner current flowing between the electrodes 11 and 12, converts the detection result to a digital signal, and externally outputs the digital signal. An external computer or oscilloscope (not shown) imports the output digital signal and performs recording or a waveform display.

Note that it is necessary to suppress an inflow of external noise to a minimum since the toner current is a weak current. In order to achieve this, the toner deposit capacitor c1, the reference capacitor c2, the resistive elements r1 and r2, the differential amplifier 5, and the voltage detection unit 6 are stored in a shield container 7. The shield container 7 serves to suppress noise caused by electromagnetic waves.

Also, the electrical properties of a wiring which connects the electrode 11 of the toner deposit capacitor c1 and the resistive element r1 are substantially the same as the electrical properties of a wiring which connects the first electrode of the reference capacitor c2 and the resistive element r2. The electrical properties of a wiring which connects the resistive element r1 and the power supply unit 4 are substantially the same as the electrical properties of a wiring which connects the resistive element r2 and the power supply unit 4. The electrical properties of a wiring which connects the electrode 12 of the toner deposit capacitor c1 and the power supply unit 4 are substantially the same as the electrical properties of a wiring which connects the second electrode of the reference capacitor c2 and the power supply unit 4. The electrical properties of a wiring which connects the resistive element r1 and the differential amplifier 5 are substantially the same as the electrical properties of a wiring which connects the resistive element r2 and the differential amplifier 5. Here, electrical properties refer to properties such as wiring capacity and impedance based on the wiring's length, diameter, material, etc. Note that in order to avoid complexity in the drawings and facilitate understanding, FIG. 1 shows only the electrical connections between various components, disregarding lengths of the wiring. Embodiments mentioned hereinafter are also similar in this regard.

Operational Procedure

Figure 2:
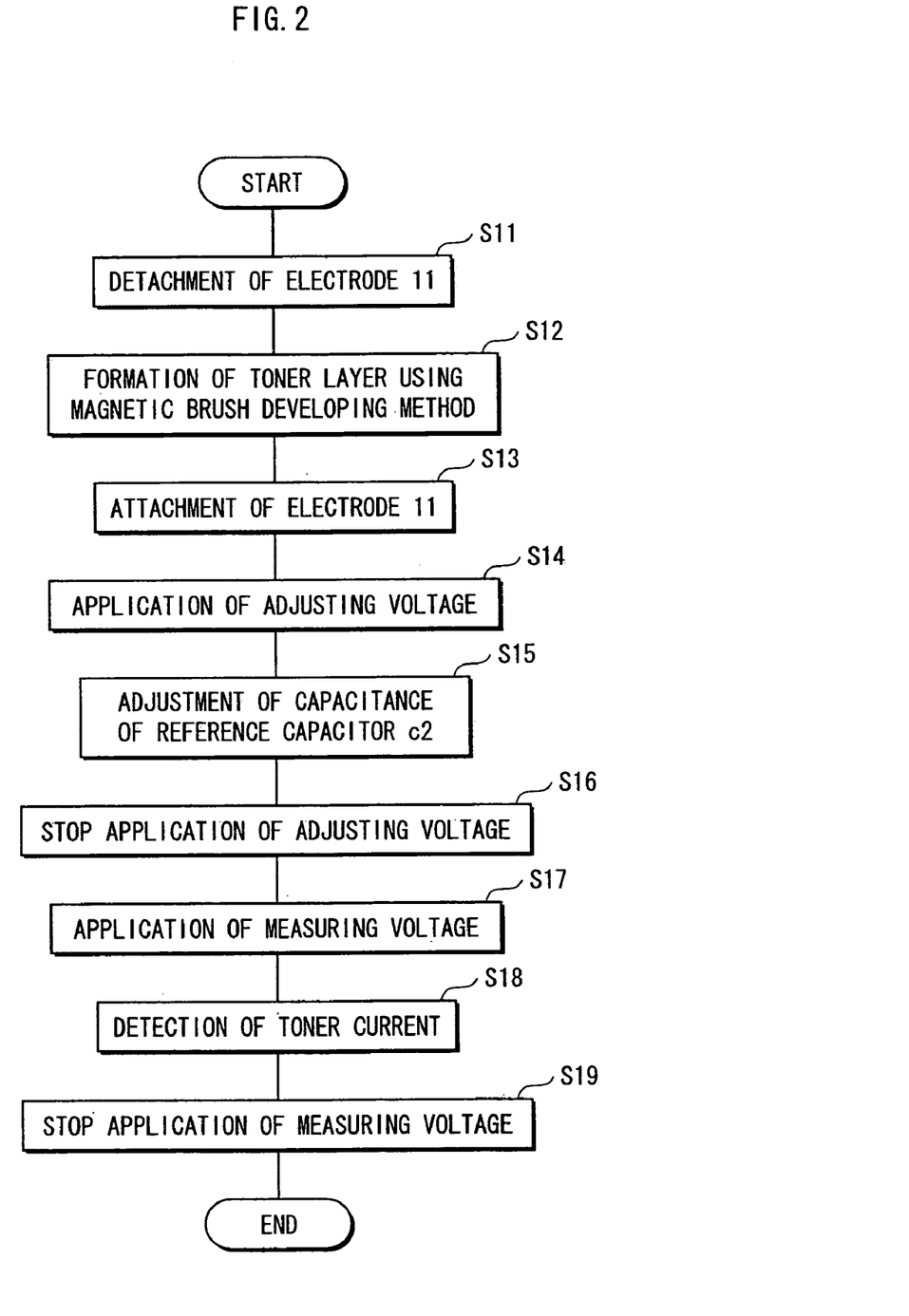
FIG. 2 shows an operational procedure of the toner current measuring device according to embodiment 1.

FIG. 2 shows an operational procedure of the toner current measuring device according to embodiment 1.

First, a toner layer is formed on the electrode 11 of the toner deposit capacitor c1 by detaching the electrode 11 from the electrophoretic cell (step S11), causing a deposit of toner on the electrode 11 (step S12), and reattaching the electrode 11 to the electrophoretic cell (step S13). As a result, it is possible to form a toner layer on the electrode 11 of the toner deposit capacitor c1. Magnetic brush developing, for example, is used for depositing the toner.

Next, the capacitance of the reference capacitor c2 is adjusted to be substantially equal to the capacitance of the toner deposit capacitor c1 when the toner layer was formed on the electrode 11. In order to achieve this, a user operates the power supply unit 4 to cause an application of an adjusting voltage for adjusting the capacitance of the reference capacitor c2 (step S14). Here, the adjusting voltage is a weak voltage which prevents the transfer of the charged toner deposited on the toner deposit capacitor c1. A specific voltage value of the adjusting voltage is set with consideration for particle size and density of the charged toner, the gap between the electrodes, etc. Generally, if the adjusting voltage is $1/10$ or less of a measuring voltage applied when measuring the toner current, it is possible to suppress the transfer of toner to a minimum. Accordingly, if the measuring voltage is 800 V, for example, the adjusting voltage is 80 V or less. Furthermore, it is preferable to make the adjusting voltage an alternating voltage. Since a charging current steadily flows if the adjusting voltage is an alternating voltage, the user can easily adjust the capacitance of the reference capacitor.

During the application of the adjusting voltage, the user adjusts the capacitance of the reference capacitor c2 to minimize the difference between the currents flowing in the toner deposit capacitor c1 and the reference capacitor c2 (step S15). The user then operates the power supply unit 4 to stop the application of the adjusting voltage (step S16).

When the adjusting voltage is applied, charging currents flow in the toner deposit capacitor c1 and the reference capacitor c2, the charging currents being based on the respective capacitances. The smaller the difference between the capacitances of both capacitors is, the smaller the difference between the charging currents measured by the measuring unit 10 is. Accordingly, it is possible to adjust the capacitances of both capacitors to be substantially equal by adjusting the capacitance of the reference capacitor c2 to minimize the measurement of the difference.

After adjusting the capacitance of the reference capacitor c2, measuring of the toner current is performed by the user operating the power supply unit 4, causing the application of the measuring voltage (step S17), and acquiring the measurement result of the measuring unit 10 when the measuring voltage is being applied (step S18.) The user then operates the power supply unit 4, and stops the application of the measuring voltage (step S19). Here, the measuring voltage is a voltage for causing the transfer between the electrodes of the toner deposited on the electrode 11. A specific voltage value of the measuring voltage is appropriately set with consideration for a charge polarity of the toner, a voltage value used in an actual image forming device, etc. Examples of a waveform of the measuring voltage are a stepped waveform which transforms from 0 V to 800 V and a rectangular waveform which alternates between −400 V and +800 V. When the measuring voltage is being applied, a composite current consisting of the toner current and the charging current flows in the toner deposit capacitor c1, and a charging current substantially the same as the charging current of the toner deposit capacitor c1 flows in the reference capacitor c2. The measuring unit 10 measures the difference between these currents as the toner current.

Exemplary Measurement

Next, examples of actual measurements of the current using the toner current measuring device pertaining to the first embodiment are shown. The areas of the electrodes 11 and 12 of the toner deposit capacitor c1 are each approximately 3 cm$^2$, while an inter-electrode distance is 150 μm.

The toner layer is charged as a result of mixing a carrier with toner having a particle diameter of 6.5 μm, and is formed using magnetic brush developing.

In this example, approximately 4.5 g/m² of toner was adhered.

Figure 3A:
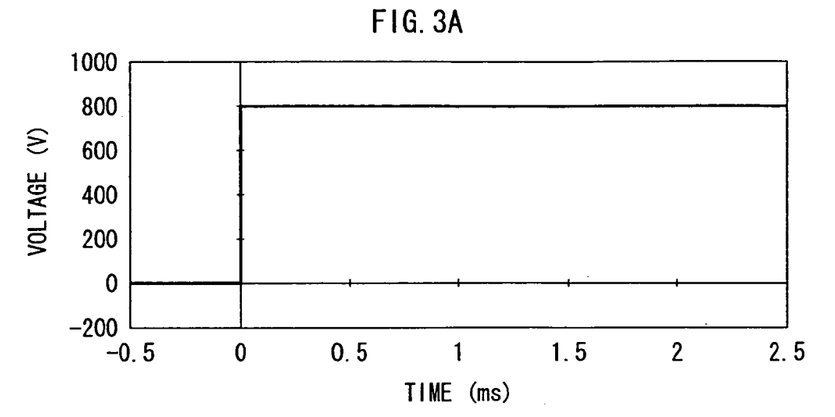
FIGS. 3A–C shows exemplary first detections according to embodiment 1.
Figure 3B:
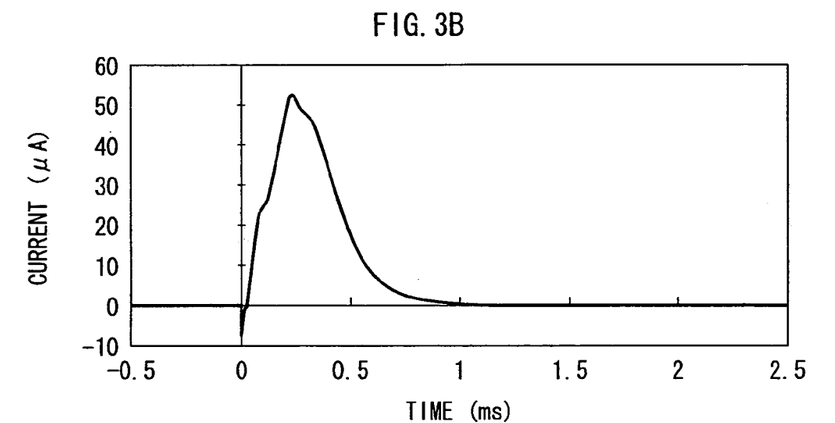
Figure 3C:
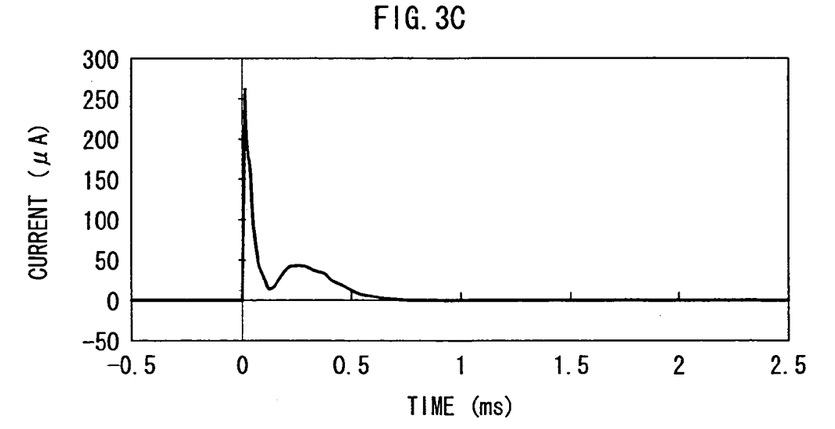

FIGS. 3A–C shows exemplary first detections according to embodiment 1.

FIG. 3A shows a measuring voltage to be applied by the power supply unit 4 when measuring the toner current. In the first exemplary measurement, the measuring voltage is a stepped waveform which transforms from 0 V to 800 V.

FIG. 3B shows a measurement result of the measuring unit 10 when the measuring voltage has been applied, whereby the capacitances of the toner deposit capacitor c1 having toner deposited thereon and the reference capacitor c2 are substantially equal.

In comparison to exemplary measurement 1, FIG. 3C shows a measurement result of the measuring unit 10 when the measuring voltage has been applied, whereby the reference capacitor c2 has been detached.

It can be seen in the measurement result of FIG. 3C that a large charging current is flowing in the toner deposit capacitor c1 when the measuring voltage transformed from 0 V to 800 V. It is extremely difficult to obtain the toner current component from the measurement result since the charging current and the toner current overlap.

On the other hand, it can be seen in the measurement results of FIG. 3B that the charging current has been nearly entirely cancelled, and only the toner current is being observed. Accordingly, it is apparent that it is possible to easily and accurately measure the toner current.

Figure 4A:
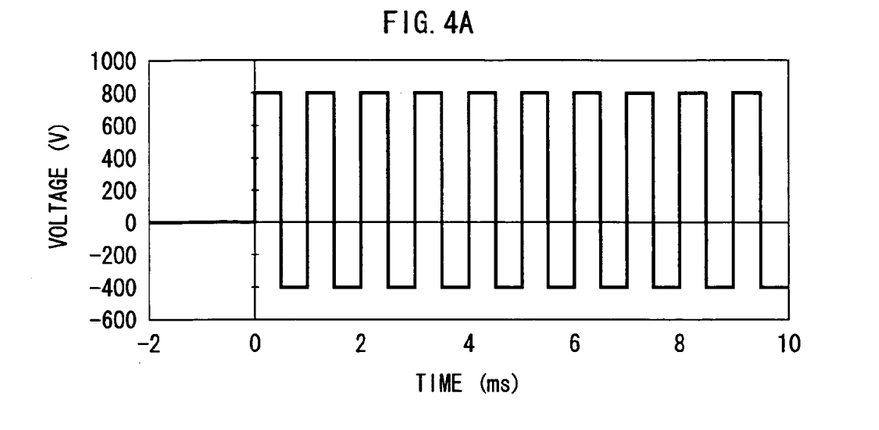
FIG. 4A–C shows exemplary second detections according to embodiment 1.
Figure 4B:
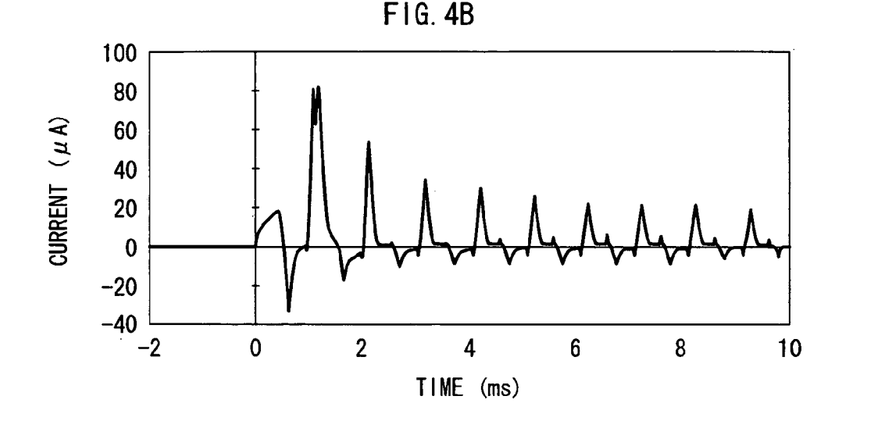
Figure 4C:
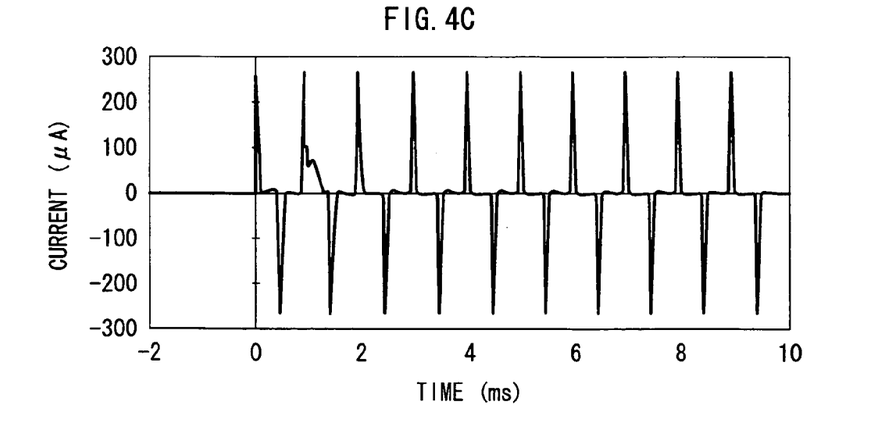

FIG. 4A–C shows exemplary second detections according to embodiment 1.

FIG. 4A shows a measuring voltage to be applied by the power supply unit 4 when measuring the toner current. In the second exemplary measurement, the measuring voltage is a rectangular waveform which alternates between −400 V and +800 V.

FIG. 4B shows a measurement result of the measuring unit 10 when the measuring voltage has been applied, whereby the capacitances of the toner deposit capacitor c1 having toner deposited thereon and the reference capacitor c2 are substantially equal.

In comparison to exemplary measurement 2, FIG. 4C shows a measurement result of the measuring unit 10 when the measuring voltage has been applied, whereby the reference capacitor c2 has been detached.

It can be seen by the rising edge and falling edge of the measuring voltage in the result of FIG. 4C that a large charging current is flowing. There are time domains appearing as shoulders, although it is difficult to distinguish only the toner current in the measurement result since the toner current and charging current overlap in nearly all the time domains.

On the other hand, it can be seen in the measurement result of FIG. 4B that the charging current has been nearly entirely cancelled, and only the toner current is being observed. Accordingly, it is possible to easily and accurately measure the toner current.

Embodiment 2

Structure

A device which measures the toner current of dry toner was described in the first embodiment. In a second embodiment, a device which measures a toner current in a liquid developer is described.

Figure 5:
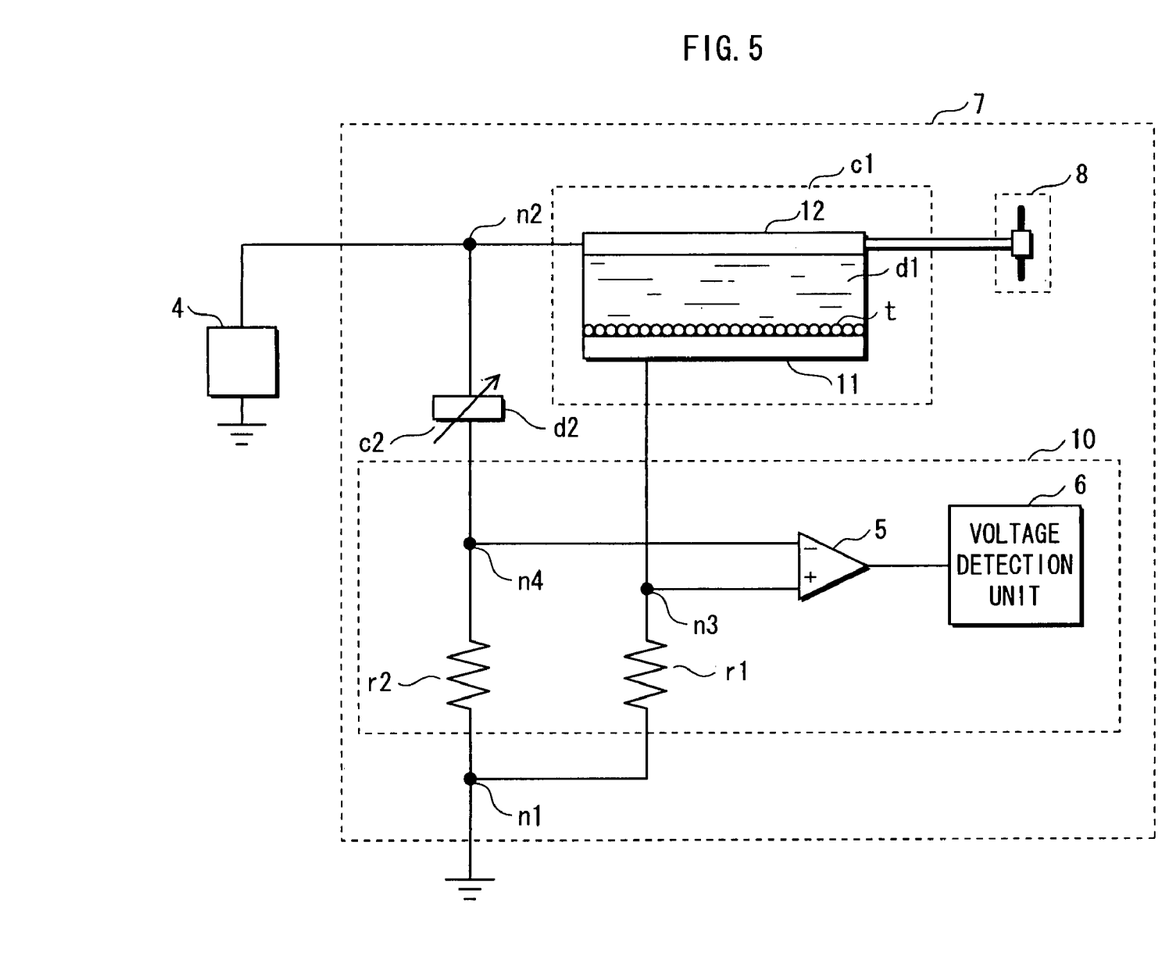
FIG. 5 shows a structure of the toner current measuring device according to embodiment 2.

FIG. 5 shows a structure of the toner current measuring device according to embodiment 2.

The toner current measuring device includes the toner deposit capacitor c1, the reference capacitor c2, the power supply unit 4, the measuring unit 10, and the shield container 7. The toner current measuring device of the second embodiment has the same circuit structure as the toner current measuring device of the first embodiment. It is necessary, however, for the toner deposit capacitor c1 to have a construction able to encapsulate a liquid since a liquid developer is used in the second embodiment. The electrophoretic cell disclosed in the aforementioned U.S. Pat. No. 6,613,209 has a construction which encapsulates a liquid. Accordingly, it is possible to employ the abovementioned electrophoretic cell as the toner deposit capacitor c1 in the second embodiment as well.

The liquid developer contains toner and a carrier liquid as its components. Given that ions are present in the carrier liquid, both the ions and toner exist as charge carriers in the liquid developer. Accordingly, it is necessary to cancel not only the charging current but also the ion current in order to accurately measure the toner current of the liquid developer.

In the second embodiment, an electrophoretic cell with the same specifications as the toner deposit capacitor c1 is employed with the goal of encapsulating the carrier liquid in the reference capacitor c2.

Operational Procedure

Figure 6:
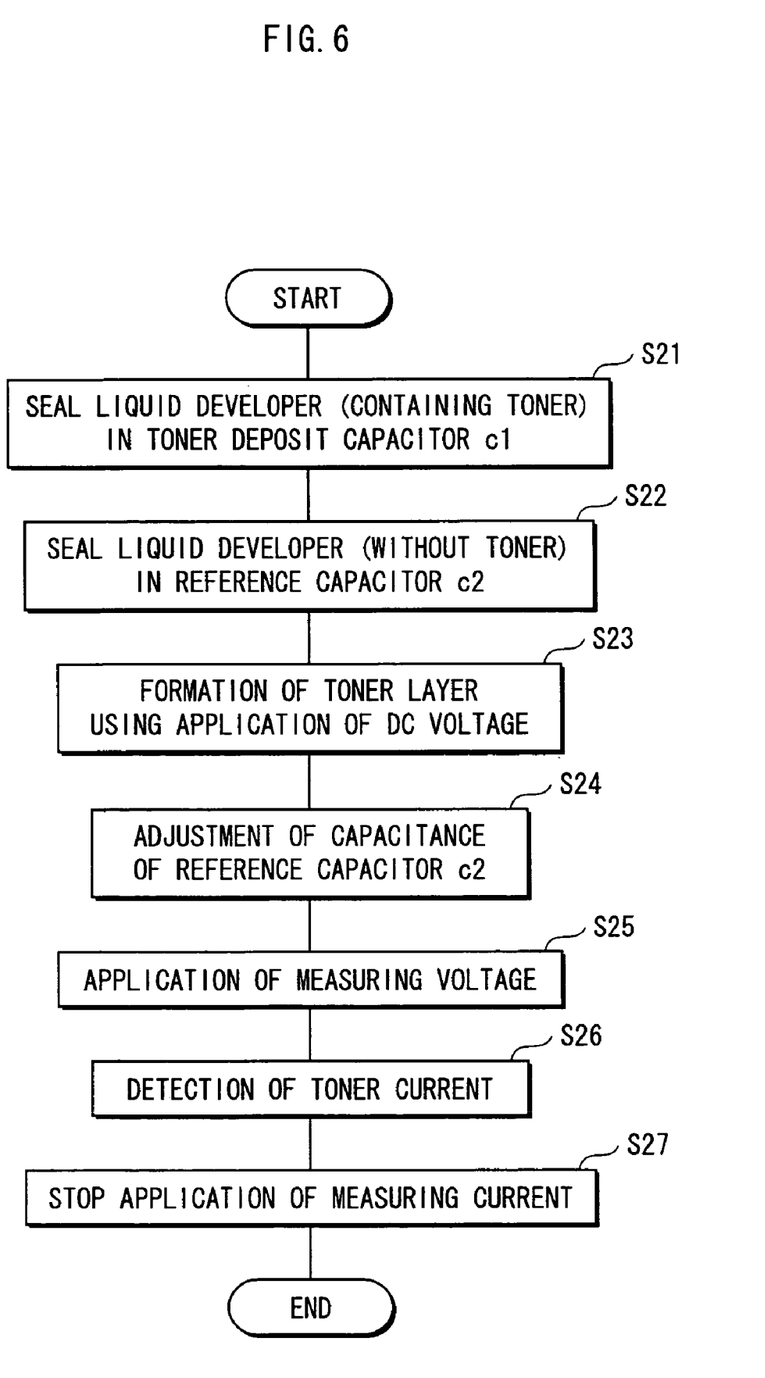
FIG. 6 shows an operational procedure of the toner current measuring device according to embodiment 2.

FIG. 6 shows an operational procedure of the toner current measuring device according to embodiment 2.

First, the user seals a liquid developer d1 which contains toner between both electrodes of the toner deposit capacitor c1 (step S21), and seals a liquid d2, being the liquid developer d1 from which toner has been removed, between the electrodes of the reference capacitor c2 (step S22).

Next, a toner layer is formed on the electrode 11 of the toner deposit capacitor c1. To achieve this, the user operates the power supply unit 4, and causes an application of a DC voltage for creating the toner layer (step S23). Here, the DC voltage causes the electrode 11 to be negatively charged if the toner is positively charged, and to be positively charged if the toner is negatively charged. As a result, the toner which was dispersed in the liquid developer is deposited as a layer on the electrode 11.

Next, the capacitance of the reference capacitor c2 is adjusted to be substantially the same as the capacitance between the electrodes 11 and 12 of the toner deposit capacitor c1. To achieve this, the user adjusts the inter-electrode distances of the reference capacitor c2 and the toner deposit capacitor c1 to be the same (step S24). Given that the specifications of the toner deposit capacitor c1 and the reference capacitor c2 are the same, it is possible to substantially equalize the capacitances of both capacitors by simply making the inter-electrode distances the same.

The remaining operational procedure is the same as from step S17 onward of FIG. 2, and its description has therefore been omitted.

Exemplary Measurement

Next, examples of actual measurements of the current using the toner current measuring device pertaining to the second embodiment is shown. The areas of the electrodes 11 and 12 of the toner deposit capacitor c1 are each approximately 1 cm², while the inter-electrode distance is 15 μm. The reference capacitor c2 is similar in this regard. Regarding the liquid developer, toner with a particle diameter of approximately 3.5 μm is dispersed in a carrier liquid consisting of a dielectric fluid (MORESCO-WHITE P120: Matsumura Oil Research Corp.) and a dispersing agent (SOLSPERSE 3000: Avecia, Ltd.) so as to be 24% by weight.

Figure 7A:
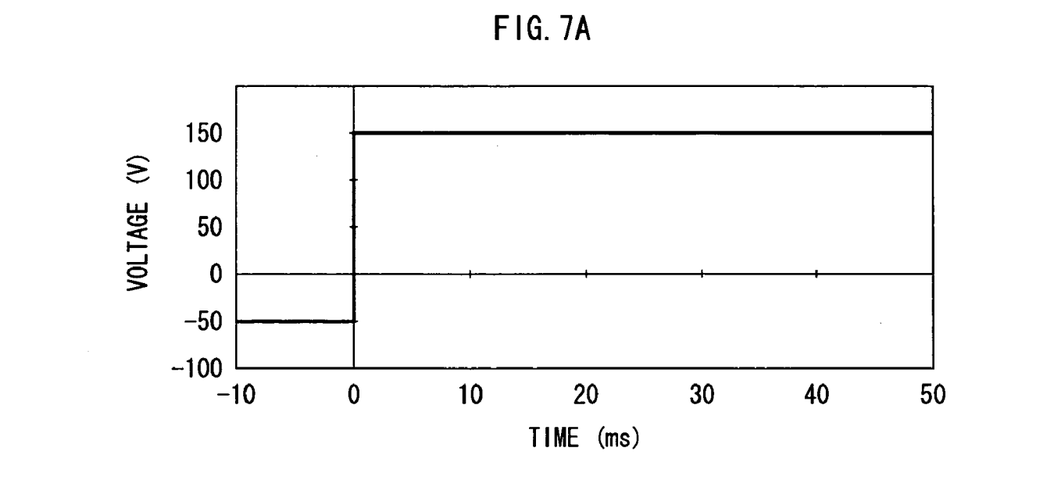
FIGS. 7A–B show exemplary second detections according to embodiment 2.
Figure 7B:
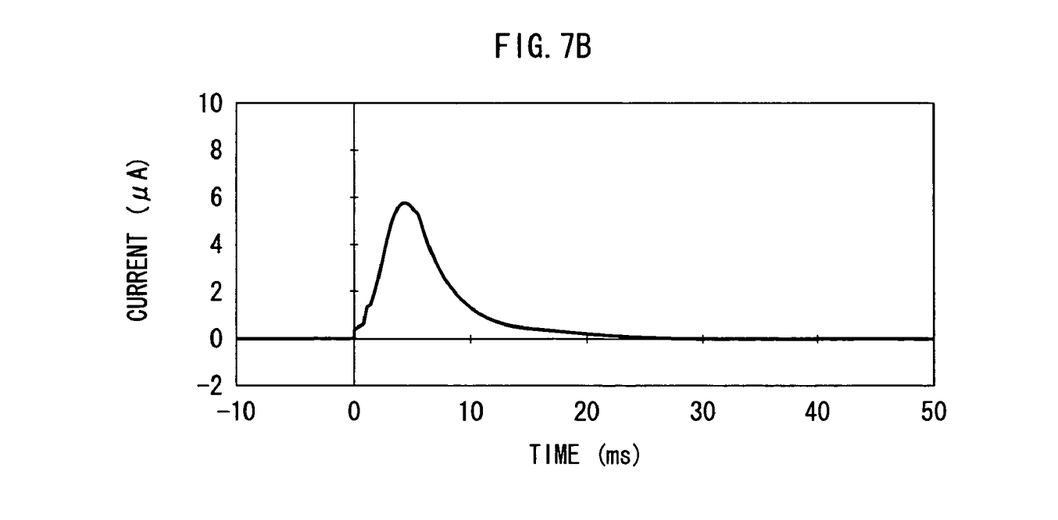

FIGS. 7A–B show exemplary second detections according to embodiment 2.

FIG. 7A shows a voltage to be applied by the power supply unit 4 when forming the toner layer and when measuring the toner current. The toner layer formation period when a −50 V DC voltage is applied is before the time "0 ms". Also, the toner current measuring period when a 150 V DC voltage is applied is after the time "0 ms".

FIG. 7B shows a measurement result of the measuring unit 10 when the measuring voltage is applied, whereby the capacitances of the toner deposit capacitor c1 having toner deposited thereon and the reference capacitor c2 are substantially equal.

It can be seen in the result of FIG. 7B that the charging current and the ion current have been nearly entirely cancelled, and only the toner current is being observed. Accordingly, it is possible to easily and accurately measure the toner current.

The toner current measuring device and toner current measuring method pertaining to the present invention have been described above based on the embodiments, although the present invention is not limited to these embodiments. For example, the present invention allows for the following variations.

(1) Parallel plates are used as the electrodes of the toner deposit capacitor c1 in the first embodiment, although the present invention is not limited as such. For example, cylindrical surface-shaped electrodes may be used.

Figure 8:
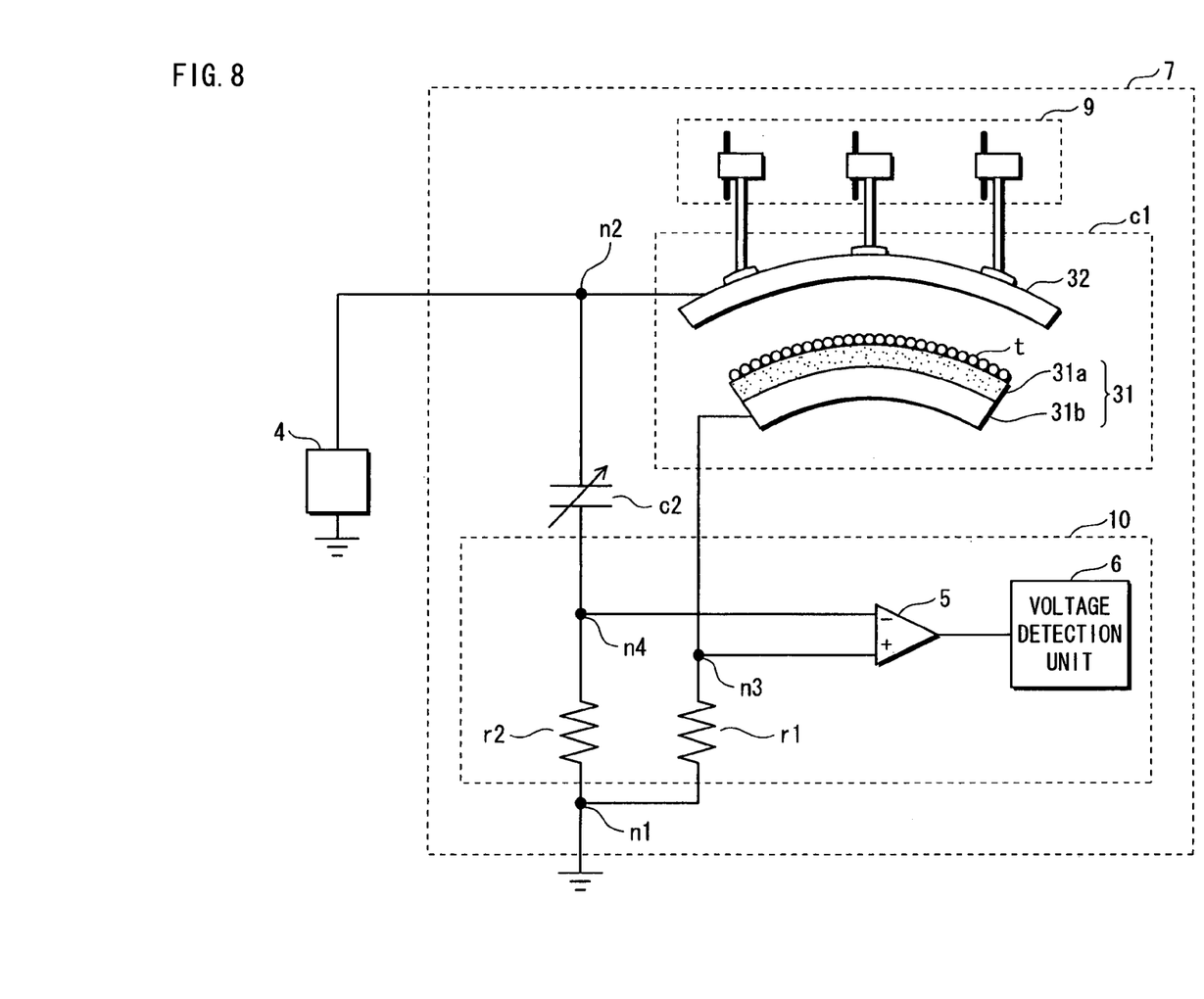
FIG. 8 shows a structure of the toner current measuring device using electrodes which have a cylindrical surface shape.

FIG. 8 shows a structure of the toner current measuring device using electrodes which have a cylindrical surface shape.

The toner current measuring device of FIG. 8 has the same circuit structure as the toner current measuring device of the first embodiment. The toner deposit capacitor c1 is formed by disposing an electrode 31 and an electrode 32 in opposition at a predetermined interval, whereby the electrodes 31 and 32 each have a cylindrical surface shape.

In actual image forming devices, toner often moves between cylindrical surface-shaped members such as a photosensitive drum and a development roller. By giving the electrodes of the toner deposit capacitor c1 a cylindrical surface, it is possible to measure the transfer properties of toner under conditions close to the shapes of actual members.

Note that the curvature of both electrodes may be fixed if the variation width of the inter-electrode distance is small and the influence on the measurement result from an inconsistency in the curvatures of the electrode pair that comes with changing the inter-electrode distance is small. If the variation width of the inter-electrode distance is large or if it is preferable to keep the measuring accuracy as high as possible, at least one of the electrodes may be made flexible, and the curvature of the electrode may be made variable by supporting the electrode at multiple places using support members (ref. sign 9) having variable support positions as shown in FIG. 8.

(2) No reference has been made in particular to the material of the electrodes of the toner deposit capacitor c1 in the embodiments, although the toner formation surface of the electrode on which the toner layer is formed may be constituted from a conductive elastomer such as conductive rubber. For example, the electrode 31 in FIG. 8 has a two-layer structure consisting of a conductive elastomer layer 31a and a conductive substrate 31b. In some actual image forming devices, toner is adhered to a conductive elastomer layer on a development roller, etc. By structuring the toner formation surface of the electrode with a conductive elastomer, it is possible to measure the transfer properties of the toner under conditions close to the material of the actual members.

(3) A CR circuit is formed from the toner deposit capacitor c1 and the resistive element r1 in the toner current measuring device described in the embodiments. A CR circuit is also formed by the reference capacitor c2 and the resistive element r2. In terms of the responsiveness of the circuits, a faster time constant is desirable. The reason for this is that since the variation of the voltage between the electrodes becomes slower if the time constant is too slow, the transfer of the toner will completely finish before changing the voltage between the electrodes to the desired voltage. This problem arises if the time constant is longer than 1 μsec. On the other hand, there are limits, in terms of detection sensitivity, to reducing the time constant of the CR circuits. In order to reduce the time constant, it is necessary to reduce the size of the electrodes, thereby degrading the detection sensitivity for the current. This problem arises if the time constant is shorter than 1 nsec.

It is, therefore, desirable to select the electrical resistance of the resistive elements and the capacitances of the capacitors so as the time constants of the above CR circuits are between 1 nsec and 1 μsec inclusive.

(4) Cases in which the areas of the electrodes of the toner deposit capacitor c1 are 1 $cm^2$ and 3 $cm^2$ have been described in the embodiments, although the present invention is not limited as such. However, as the plate areas of the toner deposit capacitor c1 falls below 1 $cm^2$, the measuring sensitivity readily becomes insufficient. As the plate areas surpass 10 $cm^2$, it becomes difficult to form an even toner layer, whereby the measuring sensitivity again readily becomes insufficient. In actual image forming devices, the area of the region in which the electric field acts, such as between the photosensitive drum and the development roller, is often in a range between 1 $cm^2$ and 10 $cm^2$ (more specifically in a range between 1 $cm^2$ and 3 $cm^2$). Accordingly, a plate area of the toner deposit capacitor c1 in the range between 1 $cm^2$ and 10 $cm^2$ is desirable in terms of measuring a toner current under conditions similar to an actual image forming device.

(5) In the embodiments, the toner layer t is formed on the electrode 11, being one of the two electrodes of the toner deposit capacitor c1, although the present invention is not limited as such. The toner layer t may be formed on the electrode 12.

(6) In the embodiments, the resistive elements r1 and r2 are used to read the amount of the current as a voltage, although the present invention is not limited as such. For example, a capacitor, inductor, etc. may be used instead of resistive elements. Also, a combination of the resistive elements, the capacitor, and the inductor may be used.

(7) In the first embodiment, adjustment of the capacitance of the reference capacitor c2 is performed by applying an adjusting voltage although methods of adjusting the capacitance are not limited as such. For example, the capacitance of the toner deposit capacitor c1 when the toner layer is formed on the electrode 11 may be obtained theoretically or experimentally, and the reference capacitor c2 may be adjusted to the obtained capacitance.

(8) In the second embodiment, the capacitance of the reference capacitor c2 is adjusted after the toner layer is formed on the toner deposit capacity c1 although this order may be reversed.

The present invention is industrially applicable as, for example, an evaluation device for evaluating the transfer properties of toner. Since the transfer properties of toner have a significant impact on the printing speed, etc. of image forming devices, the present invention is extremely useful to the manufacture of image forming devices and toner.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A toner current measuring device comprising:
a toner deposit capacitor having opposing electrodes, charged toner to be deposited on one of the electrodes;
a reference capacitor having a variable capacitance, to be configured by a user adjustment with a capacitance substantially equal to a capacitance of the toner deposit capacitor having charged toner deposited on the one electrode;
a power supply unit operable to supply power in parallel to the toner deposit capacitor and the reference capacitor; and
a measuring unit operable, when the power supply unit applies a voltage to both capacitors which causes a transfer, between the opposing electrodes, of the charged toner deposited on the one electrode, to measure a difference between a current flowing in the toner deposit capacitor and a current flowing in the reference capacitor, the difference being measured as a toner current generated by the transfer of the charged toner.

2. The toner current measuring device of claim 1, wherein the measuring unit is further operable, when the power supply unit applies a weak voltage to both capacitors which prevents the transfer, between the opposing electrodes, of the charged toner deposited on the one of the electrodes, to measure a difference between the current flowing in the toner deposit capacitor and the current flowing in the reference capacitor, the difference being measured as an indicator for adjusting the capacitance of the reference capacitor.

3. The toner current measuring device of claim 1, wherein both opposing electrodes of the toner deposit capacitor have a cylindrical surface shape.

4. The toner current measuring device of claim 1, wherein an area of each of the opposing electrodes of the toner deposit capacitor is between 1 cm$^2$ and 10 cm$^2$ inclusive.

5. The toner current measuring device of claim 1, wherein the electrode having toner deposited thereon, being one of the opposing electrodes of the toner deposit capacitor, is composed of a conductive elastomer.

6. The toner current measuring device of claim 1, wherein the toner deposit capacitor further has an electrode distance adjustment mechanism for adjusting a distance between the opposing electrodes.

7. The toner current measuring device of claim 1, wherein a waveform of the voltage applied by the power supply unit is a stepped waveform.

8. The toner current measuring device of claim 1, wherein the power supply unit applies an alternating voltage.

9. The toner current measuring device of claim 1, wherein the measuring unit comprises:
a first impedance element that is connected in series to the toner deposit capacitor;
a second impedance element that is connected in series to the reference capacitor and having an impedance substantially equal to an impedance of the first impedance element; and
a detector operable to detect a difference between (i) a voltage induced at both ends of the first impedance element according to the current flowing in the toner deposit capacitor and (ii) a voltage induced at both ends of the second impedance element according to the current flowing in the reference capacitor, the difference being detected as a signal showing an amount of the toner current.

10. The toner current measuring device of claim 9, wherein
the first impedance element is a resistive element, and
a time constant of a CR circuit constituted from the toner deposit capacitor and the resistive element is from 1 nsec to 1 μsec inclusive.

11. The toner current measuring device of claim 9, wherein
an electrical property of a wiring which connects a first electrode of the toner deposit capacitor and the first impedance element is substantially the same as an electrical property of a wiring which connects the first electrode of the reference capacitor and the second impedance element,
an electrical property of a wiring which connects the first impedance element and the power supply unit is substantially the same as an electrical property of a wiring which connects the second impedance element and the power supply unit,
an electrical property of a wiring which connects a second electrode of the toner deposit capacitor and the power supply unit is substantially the same as an electrical property of a wiring which connects the second electrode of the reference capacitor and the power supply unit, and
an electrical property of a wiring which connects the first impedance element and the detector is substantially the same as an electrical property of a wiring which connects the second impedance element and the detector.

12. The toner current measuring device of claim 9, wherein
the toner deposit capacitor, the reference capacitor, the first impedance element, the second impedance element, the detector, and the interconnecting wiring is stored in a shield-container which blocks electromagnetic waves.

13. A toner current measuring method, comprising:
a depositing step of depositing charged toner on one of opposing electrodes provided in a toner deposit capacitor;
an adjusting step of adjusting a capacitance of a reference capacitor having a variable capacitance to be substantially equal to a capacitance of the toner deposit capacitor having the one of the electrodes with charged toner deposited thereon; and
a measuring step of measuring, after the depositing step and the adjusting step and upon applying in parallel a voltage to both capacitors to cause a transfer, between the opposing electrodes, of the charged toner deposited on the one of the electrodes, a difference between a current flowing in the toner deposit capacitor and a current flowing in the reference capacitor, the difference being measured as a toner current generated by the transfer of the charged toner.

14. The toner current measuring method of claim 13, wherein
the adjusting step adjusts, after the depositing step and upon applying a weak voltage to prevent the transfer of the charged toner deposited on the one of the electrodes, the capacitance of the reference capacitor so as to minimize the difference between the current flowing in the toner deposit capacitor and the current flowing in the reference capacitor.

15. The toner current measuring method of claim 14, wherein
the weak voltage applied in the adjusting step is an alternating voltage.

16. The toner current measuring method of claim 14, wherein an amplitude of the weak voltage applied in the adjusting step does not exceed 1/10 the amplitude of the voltage applied in the measuring step.

17. The toner current measuring method of claim 13, further comprising:

a sealing step of sealing, before the depositing step, charged toner and a carrier liquid between the opposing electrodes of the toner deposit capacitor, while sealing the same carrier liquid between electrodes of the reference capacitor.

18. The toner current measuring method of claim 17, wherein the depositing step deposits charged toner on one of opposing electrodes by applying a DC voltage to the toner deposit capacitor.

* * * * *